United States Patent
Menkhoff (10) Patent No.: US 10,237,113 B2
(45) Date of Patent: Mar. 19, 2019

(54) APPARATUS AND A METHOD FOR APPROXIMATING A FIRST SIGNAL USING A SECOND SIGNAL

(71) Applicant: Intel IP Corporation, Santa Clara, CA (US)

(72) Inventor: Andreas Menkhoff, Oberhaching (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/752,263

(22) PCT Filed: Sep. 25, 2015

(86) PCT No.: PCT/IB2015/057379
§ 371 (c)(1),
(2) Date: Feb. 13, 2018

(87) PCT Pub. No.: WO2017/051219
PCT Pub. Date: Mar. 30, 2017

(65) Prior Publication Data
US 2019/0028321 A1   Jan. 24, 2019

(51) Int. Cl.
*H04L 27/36* (2006.01)
*H04B 1/04* (2006.01)

(52) U.S. Cl.
CPC ............. *H04L 27/364* (2013.01); *H04B 1/04* (2013.01); *H04L 27/366* (2013.01)

(58) Field of Classification Search
CPC ....... H04B 1/0475; H04B 1/62; H03F 1/3282; H04L 27/361

USPC ....................... 375/296; 455/114.2
See application file for complete search history.

(56) References Cited

U.S. PATENT DOCUMENTS

| 6,822,595 | B1 | 11/2004 | Robinson |
| 9,565,043 | B1* | 2/2017 | Li Puma ............. H04L 27/2032 |
| 2006/0049971 | A1* | 3/2006 | Quilligan ................ H03M 1/68 341/144 |
| 2018/0198661 | A1* | 7/2018 | Palmers ................. H04B 1/123 |

FOREIGN PATENT DOCUMENTS

| EP | 1538754 A1 | 6/2005 |
| EP | 2905902 A1 | 8/2015 |

OTHER PUBLICATIONS

Groe J: "Polar Transmitters for Wireless Communications", IEEE Communications Magazine, vol. 45, No. 9, Sep. 1, 2007, pp. 58-63.

* cited by examiner

*Primary Examiner* — Kevin Kim
(74) *Attorney, Agent, or Firm* — 2SPL Patentanwaelte PartG mbB; Mani Arabi (57) ABSTRACT

A method for approximating a first signal having a first oscillation period within a quantized time interval using a second signal is provided. The second signal has a second oscillation period. The method includes calculating a phase offset of the first signal at at least one position within the quantized time interval. Further, the method comprises shifting the second signal within the quantized time interval until a phase offset of the second signal at the at least one position satisfies a quality criterion related to the phase offset of the first signal.

25 Claims, 7 Drawing Sheets

APPARATUS AND A METHOD FOR APPROXIMATING A FIRST SIGNAL USING A SECOND SIGNAL

FIELD

Examples relate to transmitter technology. In particular, examples relate to an apparatus and a method for approximating a first signal using a second signal. Some examples relate to an apparatus and a method for generating an analog radio frequency signal using a digital signal. Further examples relate to an apparatus and a method for generating an analog radio frequency signal using a sample of a digital signal

BACKGROUND

A Radio Frequency (RF) transmitter has to fulfill a certain frequency band-dependent output power spectrum mask according to a communication standard (e.g. defined by the 3rd Generation Partnership Project, 3GPP). A polar transmitter commonly has a higher efficiency than a conventional I/Q transmitter. However, for a polar transmitter, the time quantization (of the zero crossing) determines mainly the out-of-band noise of the output RF signal. A large time quantization may be easy to achieve technically but leads to large out-of-band noise. A small time quantization may be achieved with sophisticated (and thus heavily current consuming) Digital-to-Time Converter (DTC) circuits and lead to small out-of-band noise. Additionally, for a periodic input to the polar transmitter, a periodic time quantization causes spurious signal components in the output RF signal due to periodic pattern.

Hence, there may be a desire for an improved transmitter architecture.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. In contrast, when an element is referred to as being "directly connected" or "directly coupled" to another element, there are no intervening elements present. Other words used to describe the relationship between elements should be interpreted in a like fashion (e.g. "between" versus "directly between", "adjacent" versus "directly adjacent"), to name just a few examples.

The terminology used herein is for the purpose of describing particular examples is not intended to be limiting for further examples. Whenever a singular form such as "a," "an" and "the" is used and using only a single element is neither explicitly or implicitly defined as being mandatory, further examples may also plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong, unless expressly defined otherwise herein.

In the following, various examples relate to devices (e.g. cell phone, base station) or components (e.g. transmitter, transceiver) of devices used in wireless or mobile communications systems. A mobile communication system may, for example, correspond to one of the mobile communication systems standardized by the 3rd Generation Partnership Project (3GPP), e.g. Global System for Mobile Communications (GSM), Enhanced Data rates for GSM Evolution (EDGE), GSM EDGE Radio Access Network (GERAN), High Speed Packet Access (HSPA), Universal Terrestrial Radio Access Network (UTRAN) or Evolved UTRAN (EUTRAN), Long Term Evolution (LTE) or LTE-Advanced (LTE-A), or mobile communication systems with different standards, e.g. Worldwide Interoperability for Microwave Access (WIMAX) IEEE 802.16 or Wireless Local Area Network (WLAN) IEEE 802.11, generally any system based on Time Division Multiple Access (TDMA), Frequency Division Multiple Access (FDMA), Orthogonal Frequency Division Multiple Access (OFDMA), Code Division Multiple Access (CDMA), etc. The terms mobile communication system and mobile communication network may be used synonymously.

The mobile communication system may comprise a plurality of transmission points or base station transceivers operable to communicate radio signals with a mobile transceiver. In some examples, the mobile communication system may comprise mobile transceivers, relay station transceivers and base station transceivers. The relay station transceivers and base station transceivers can be composed of one or more central units and one or more remote units.

A mobile transceiver or mobile device may correspond to a smartphone, a cell phone, User Equipment (UE), a laptop, a notebook, a personal computer, a Personal Digital Assistant (PDA), a Universal Serial Bus (USB)-stick, a tablet computer, a car, etc. A mobile transceiver or terminal may also be referred to as UE or user in line with the 3GPP terminology. A base station transceiver can be located in the fixed or stationary part of the network or system. A base station transceiver may correspond to a remote radio head, a transmission point, an access point, a macro cell, a small cell, a micro cell, a pico cell, a femto cell, a metro cell etc. The term small cell may refer to any cell smaller than a macro cell, i.e. a micro cell, a pico cell, a femto cell, or a metro cell. Moreover, a femto cell is considered smaller than a pico cell, which is considered smaller than a micro cell. A base station transceiver can be a wireless interface of a wired network, which enables transmission and reception of radio signals to a UE, mobile transceiver or relay transceiver. Such a radio signal may comply with radio signals as, for example, standardized by 3GPP or, generally, in line with one or more of the above listed systems. Thus, a base station transceiver may correspond to a NodeB, an eNodeB, a BTS, an access point, etc. A relay station transceiver may correspond to an intermediate network node in the communication path between a base station transceiver and a mobile station transceiver. A relay station transceiver may forward a signal received from a mobile transceiver to a base station transceiver, signals received from the base station transceiver to the mobile station transceiver, respectively.

The mobile communication system may be cellular. The term cell refers to a coverage area of radio services provided by a transmission point, a remote unit, a remote head, a remote radio head, a base station transceiver, relay transceiver or a NodeB, an eNodeB, respectively. The terms cell and base station transceiver may be used synonymously. In some examples a cell may correspond to a sector. For example, sectors can be achieved using sector antennas, which provide a characteristic for covering an angular section around a base station transceiver or remote unit. In some examples, a base station transceiver or remote unit may, for example, operate three or six cells covering sectors of 120° (in case of three cells), 60° (in case of six cells) respectively. Likewise a relay transceiver may establish one or more cells in its coverage area. A mobile transceiver can be registered or associated with at least one cell, i.e. it can be associated to a cell such that data can be exchanged between the network and the mobile in the coverage area of the associated cell using a dedicated channel, link or connection. A mobile transceiver may hence register or be associated with a relay station or base station transceiver directly or indirectly, where an indirect registration or association may be through one or more relay transceivers.

Figure 1:
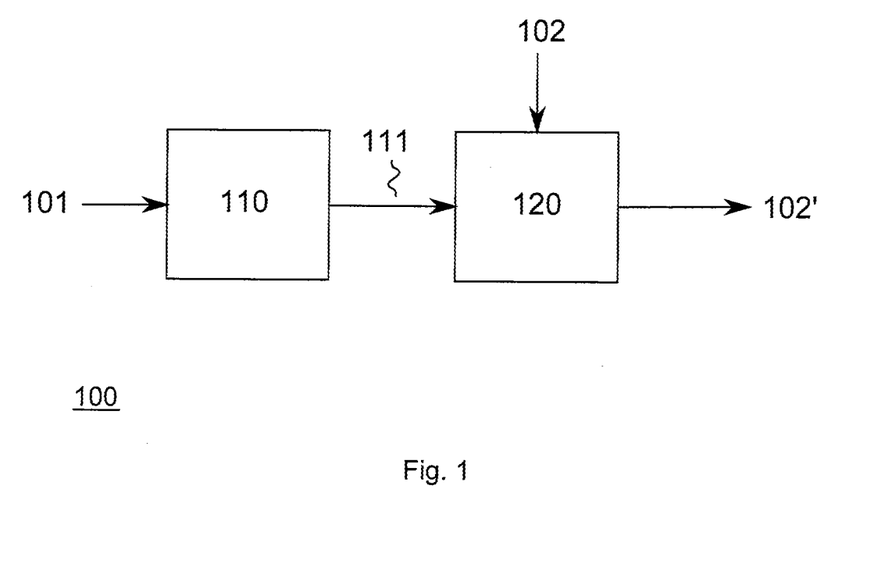
FIG. 1 illustrates an example of an apparatus for approximating a first signal using a second signal.

FIG. 1 illustrates an apparatus 100 for approximating a first signal 101 within a quantized time interval using a second signal 102. The first signal 101 comprises a first oscillation period (i.e. an oscillation period of a first length), whereas the second signal comprises a second oscillation period (i.e. an oscillation period of a second length) that is different from the first oscillation period. The second oscillation period may, in some examples, be different from the length of the quantized time interval. In some examples, the second oscillation period may be equal to the length of the quantized time interval. The length of the quantized time interval may in some examples be related (e.g. be equal) to the length of the quantized oscillation period of the first signal 101.

A processing module 110 of the apparatus 100 receives the first signal 101 and calculates a phase offset of the first signal 101 at at least one position within the quantized time interval. For example, the at least one position may be the center of the quantized time interval. In some examples, the at least one position may be a first edge of the quantized time interval and a second position may be a (different) second edge of the quantized time interval.

The apparatus 100 further comprises a shifting module 120 for shifting the second signal 102 within the quantized time interval until a phase offset of the second signal 102 at the one position satisfies a quality criterion related to the phase offset of the first signal 101. For example, the phase offset of the second signal 102 may be equal to the phase offset of the first signal 101 at the center of the quantized time interval. In some examples, the phase offset of the second signal 102 at the first edge and the second edge is equal to a mean value of the phase offsets of the first signal 101 at the first edge and the second edge of the quantized time interval. The shifted second signal 102' is output by the shifting module 120 as approximation of the first signal 101.

In general, the apparatus 100 may allow to approximate the first signal with high accuracy. The apparatus 100, when used in a polar transmitter, may allow to minimize the error between the original (desired) transmit signal (i.e. the first signal) and the generated analog RF transmit signal (i.e. the second signal) compared to conventional polar transmitter architecture.

The advantages of the apparatus will become more apparent from the example illustrated in FIGS. 2a to 2e.

Figure 2A:
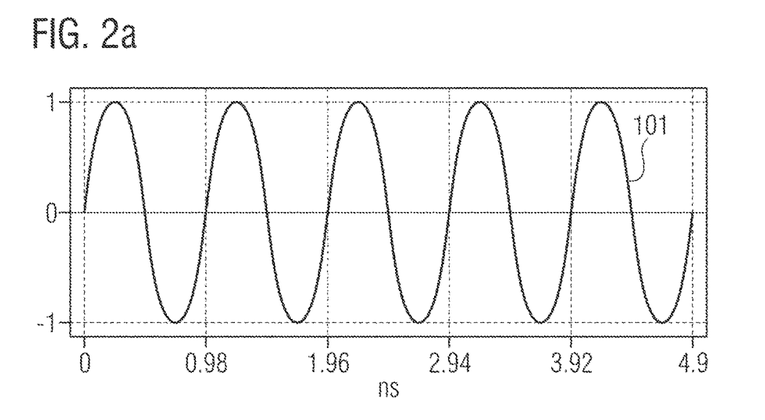
FIG. 2a illustrates an example of the first signal.

In FIG. 2a, the temporal course of the first signal 101 (e.g. a desired RF transmit signal) is illustrated for five oscillation periods. The first signal 101 has an example frequency $f_{first}$=1020.408162134 MHz, i.e., a first oscillation period of τ=0.98 ns.

Figure 2B:
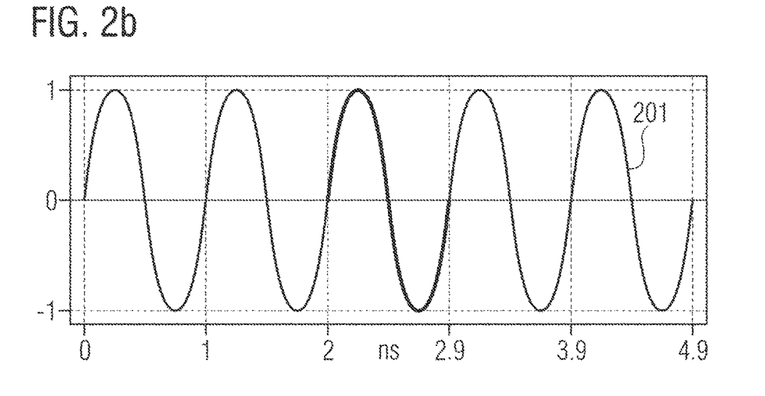
FIG. 2b illustrates an example of an approximation of the first signal using conventional polar transmitter architecture.

As a comparison, FIG. 2b illustrates an example of an approximation 201 of the first signal 101 using conventional polar transmitter architecture. In the example of FIG. 2b, it is assumed that the polar transmitter has a time resolution of 0.1 ns, i.e., a time resolution that is coarser than the time resolution of the first oscillation period. Hence, the zero crossings of the first signal 101 are quantized on the grid of the time resolution of the conventional polar transmitter.

The first signal 101 has its zero crossings at 0 ns, 0.98 ns, 1.96 ns, 2.94 ns, 3.92 ns and 4.9 ns as illustrated in FIG. 2a. Due to the coarser time resolution of the conventional polar transmitter, these zero crossings are quantized to their nearest neighbors on the grid of the time resolution of the conventional polar transmitter. That is, the zero crossings of the approximation 201 are at 0 ns, 1 ns, 2 ns, 2.9 ns, 3.9 ns and 4.9 ns. In other words, the approximation 201 comprises two different oscillation periods—0.9 ns and 1 ns. That is, the constant oscillation period length of the first (desired) signal 101 is changed to a variable oscillation period length for the approximation 201. In other words, quantized time intervals, which are delimited by the zero crossings of the approximation, are provided and each quantized time interval comprises one full oscillation. The oscillation in the quantized time interval of the approximation 201 has zero phase offset, i.e., in each quantized time interval the exemplary sinusoidal oscillation starts and ends with an amplitude value of zero at the edges of the quantized time interval. For example, the oscillation in the quantized time interval from 1 ns to 2 ns starts with an amplitude of zero and ends after one full oscillation again with an amplitude of zero. Hence, the phase is steady between adjacent quantized time intervals.

Figure 2C:
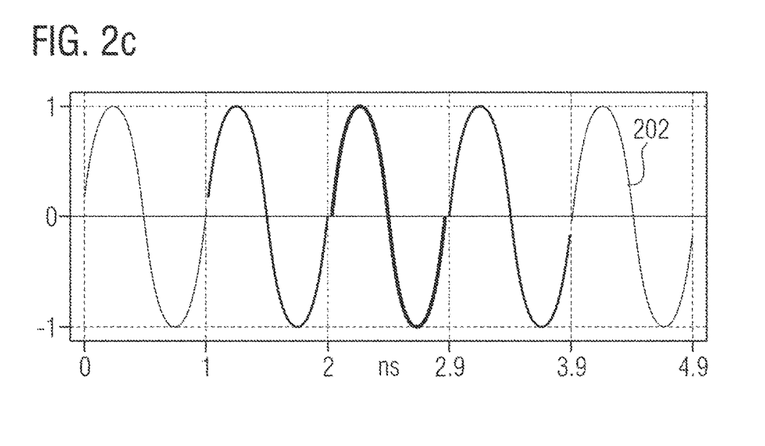
FIG. 2c illustrates an example of an approximation of the first signal according to examples described herein.

FIG. 2c illustrates an approximation 202 of the first signal 101 according to examples described herein. The time resolution is again 0.1 ns, so that the quantized nearest neighbor positions for the zero crossings of the first signal 101 are again at 0 ns, 1 ns, 2 ns, 2.9 ns, 3.9 ns and 4.9 ns for the approximation 202. That is, again quantized time intervals which are delimited at 0 ns, 1 ns, 2 ns, 2.9 ns, 3.9 ns and 4.9 ns are provided. However, in contrast to the conventional polar transmitter, the oscillation in the quantized time interval effectively has a phase offset. That is, the oscillation in the quantized time interval starts and ends with non-zero amplitude values. For example, the oscillation in the quantized time interval from 1 ns to 2 ns starts with an amplitude greater than zero and ends after one full oscillation again with an amplitude greater than zero. As illustrated in FIG. 2c, phase jumps may occur between adjacent quantized time intervals.

Figure 2D:
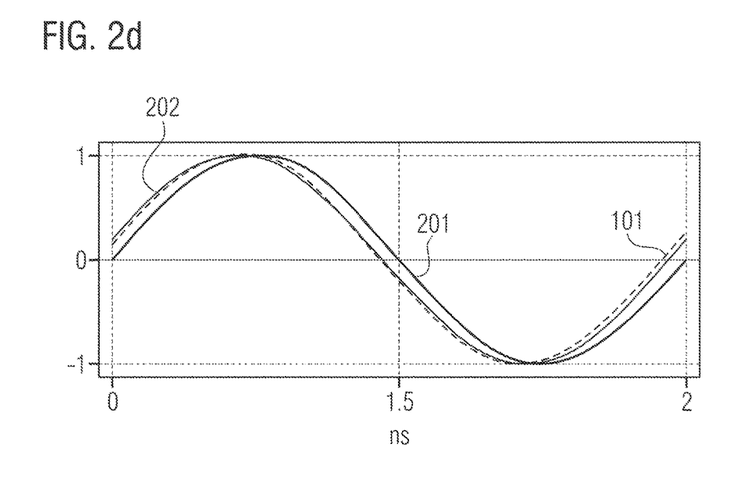
FIG. 2d illustrates a comparison between the first signal, the approximation of the first signal using conventional polar transmitter architecture, and the approximation of the first signal according to examples described herein.

FIG. 2d illustrates a comparison between the first signal 101, the approximation 201 of the first signal 101, and the approximation 202 of the first signal 101 for the oscillation in the quantized time interval from 1 ns to 2 ns.

The oscillation of the approximation 201 has its zero crossings at 1 ns and 2 ns, i.e., the oscillation starts at the first edge of the quantized time interval at 1 ns and ends at the second edge of the quantized time interval at 2 ns. That is, the oscillation has no a phase offset with respect to the quantized time interval.

The first signal 101 has its zero crossings at 0.98 ns and 1.96 ns as illustrated in FIG. 2a. In other words, the oscillation of the first signal 101 starts already outside the quantized time interval. Accordingly, the oscillation of the first signal 101 has an effective phase offset with respect to the quantized time interval.

The oscillation of the approximation 202 has—similar to the first signal 101—an effective phase offset with respect to the quantized time interval. That is, the zero crossing of the oscillation of the approximation 202 does not coincide with the edge of the quantized time interval (as it is the case for the conventional polar transmitter). The oscillation of the approximation 202 effectively starts outside the quantized time interval similar to the oscillation of the first signal 101.

FIG. 2d further illustrates how the phase offset for the second signal may be calculated in order to provide the approximation 202 for the first signal 101. As illustrated in FIG. 2d, the phase offset between the first signal 101 and the approximation 202 is zero or almost zero. Hence, the phase offset of the second signal may be chosen to be equal to the phase offset of the first signal 101 at the center of the quantized time interval. As illustrated in FIG. 2d, the amplitude of the approximation is higher than the one of the first signal 101 at the first edge of the quantized time interval at 1 ns, whereas the amplitude of the approximation is lower than the one of the first signal 101 at the second edge of the quantized time interval at 2 ns. Hence, the phase offset of the second signal at the first edge and the second edge of the quantized time interval may be chosen to be equal to a mean value of the phase offsets of the first signal at the first edge and the second edge of the quantized time interval.

Figure 2E:
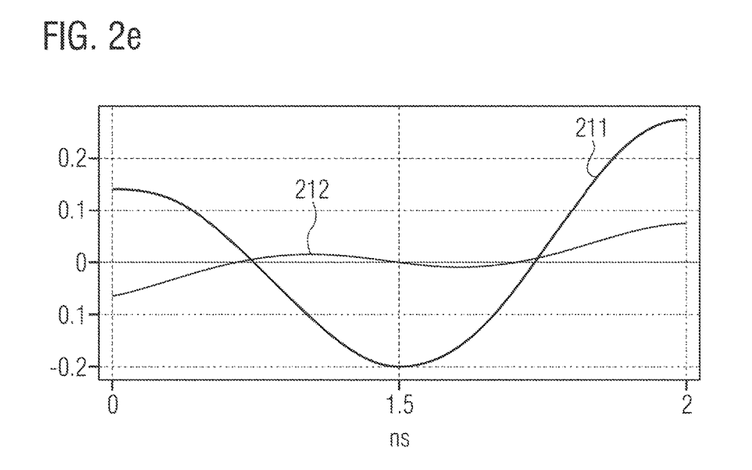
FIG. 2e illustrates a comparison between an approximation error of the approximation of the first signal using conventional polar transmitter architecture, and an approximation error of the approximation of the first signal according to examples described herein.

As indicated in FIG. 2d, the approximation error for approximation 202 is smaller than for the conventional approximation 201. This becomes more evident from FIG. 2e. FIG. 2e illustrates a comparison between an approximation error of the approximation 201 of the first signal 101, and an approximation error of the approximation 202 of the first signal 101 for the quantized time interval from 1 ns to 2 ns.

As illustrated in FIG. 2e, the absolute approximation error 212 of the approximation 202 is smaller than the approximation error 211 of the approximation 201. Hence, a time error between the approximation 202 and the first signal 101 is smaller than a time error between the conventional approximation 201 and the first signal 101. According to Parseval's theorem, a smaller time in the time domain error results in a smaller frequency error in the frequency domain. In the example illustrated in FIGS. 2a to 2e, the error energy for the approximation 202 of the first signal 101 is 13.8 dB (Decibel) smaller than the error energy for the conventional approximation 201 of the first signal 101.

Generally speaking, some examples of the proposed concept relate to a means for approximating a first signal within a quantized time interval using a second signal. The first signal comprises a first oscillation period and the second signal comprises a different second oscillation period. The means comprises a means for calculating a phase offset of the first signal at at least one position within the quantized time interval. Further, the means comprises a means for shifting the second signal within the quantized time interval until a phase offset of the second signal at the one position satisfies a quality criterion related to the phase offset of the first signal.

The means for approximating the first signal may be implemented by an apparatus for approximating a first signal using a second signal described above or below (e.g. FIG. 1). The means for calculating the phase offset may be implemented by a processing module described above or below (e.g. FIG. 1). The means for shifting the second signal may be implemented by a shifting module described above or below (e.g. FIG. 1).

Figure 3A:
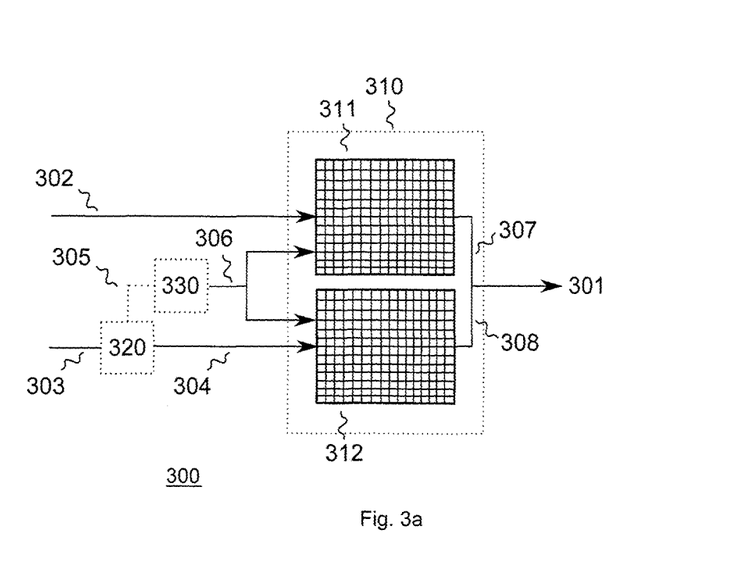
FIG. 3a illustrates an example of an apparatus for generating an analog RF signal using a digital signal.

An example of an implementation using signal approximation according to one or more of the above aspects is illustrated in FIG. 3a. FIG. 3a illustrates an apparatus 300 for generating an analog RF signal 301 using a digital signal comprising a radius component 302 and a second component 303 related to an oscillation period of the digital signal. For example, the second component 303 may be a phase component of the digital signal, or an equivalent component in the time domain. In general, the digital signal comprises a plurality of oscillation periods.

The apparatus 300 comprises a first plurality of digital-to-analog converter (DAC) cells 311. The first plurality of DAC cells 311 generates a first contribution 307 to the analog RF signal 301 based on the radius component 302 and a local oscillator (LO) signal 306 related to a quantized length 305 of the oscillation period. For example, the second component 303 may be provided (supplied) to a quantization circuit 320 in order to quantize the oscillation period of the digital signal. Information on the quantized length 305 of the oscillation period may be provided (supplied) to a LO 330 in order to provide the LO signal 306 based on the quantized length 305 of the oscillation period. For example, a frequency of the LO signal 306 may be adjusted based on the quantized length 305 of the oscillation period.

The apparatus 300 further comprises a second plurality of DAC cells 312. The second plurality of DAC cells 312 generates a second contribution 308 to the analog RF signal 301 based on the LO signal 306 and a quantization error 304 of the quantized length 305 of the oscillation period. For example, the quantization error 304 may be provided by the quantization circuit 320 together with the quantized length 305 of the oscillation period.

In some examples, the first and the second plurality of DAC cells 311, 312 may be comprised by one DAC 310 as illustrated FIG. 3a. Accordingly, the first and the second contributions 307, 308 to the analog RF signal 301 may be combined internally in the DAC 310, so that the DAC 310 provides the analog RF signal 301.

Figure 3B:
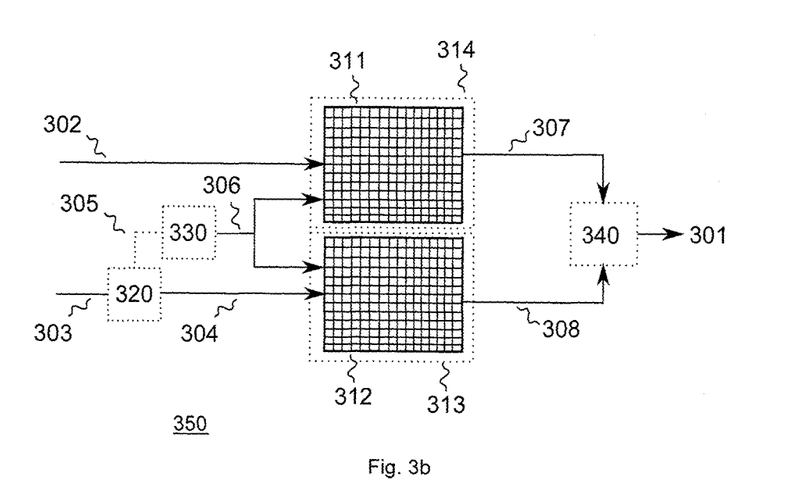
FIG. 3b illustrates another example of an apparatus for generating an analog RF signal using a digital signal.

In other examples, the first plurality of DAC cells 311 may be comprised by a first DAC 314, and the second plurality of DAC cells 312 may be comprised by a second DAC 313 as illustrated in FIG. 3b. Hence, the first contribution 307 to the analog RF signal 301 may be provided by the first DAC 314, and the second contribution 308 to the analog RF signal 301 may be provided by the second DAC 313. Accordingly, the apparatus 300 may further comprise a signal combiner 340 for combining the first contribution 307 to the analog RF signal 301 and the second contribution 308 to the analog RF signal 301.

Compared to conventional polar transmitter architectures, the apparatus 300 generates the analog RF signal 301 not only based on the radius component 302 and the LO signal 306, which is based on the oscillation period (i.e. on phase information) of the digital signal. The apparatus 300 further employs the second contribution 308, which is based on the quantization error of the oscillation period. The second contribution 308 may allow to modify the amplitude of the first contribution 307 in order to generate the analog RF signal 301. By modifying the amplitude of the first contribution 307 with the second contribution 308, effective phase offsets may be introduced so that a desired RF transmit signal (which is described by the digital signal) may be approximated with high accuracy by the analog RF signal 301. In particular, the second contribution 308 may allow to introduce individual effective phase offsets for the quantized oscillation periods of the digital signal. Accordingly, a more accurate approximation of the desired RF transmit signal by the analog RF signal 301 may be achieved compared to conventional polar transmitter architectures (see also FIGS. 2a to 2e highlighting this effect). Compared to more sophisticated polar transmitter concepts, highly accurate approximation of the desired RF transmit signal may be achieved without employing current consuming DTC circuits. Hence, a required power for generating a RF signal may be reduced compared to polar transmitter concepts using DTC circuits.

In some examples, the second plurality of DAC cells may further generate the second contribution 308 to the analog RF signal 301 based on the radius component 302. For example, the quantization error 304 may further be weighted with the radius component 302. Therefore, the apparatus 300 may comprise a corresponding weighting unit (not illustrated). Accordingly, the instantaneous value of the radius component 302 may be considered for generating the second contribution 308. Hence, an amplitude modification (i.e. the second contribution 308) may be generated which is adapted to the instantaneous value of the first contribution 307 (i.e. the value of the radius component 302). Accordingly, a further increased accuracy of the approximation desired RF transmit signal by the analog RF signal 301 may be achieved.

In some examples, the quantization error 304 may further be weighted with the quantized length 305 of the oscillation period (e.g. using the weighting unit). In other examples, the quantization error 304 may be weighted with a mean value of the quantized length 305 of the oscillation period and the quantized length 305 of at least one further oscillation period of the digital signal. Hence, variations of the quantized length of the oscillation periods of the digital signal may be considered for generating the second contribution 308. Accordingly, a further increased accuracy of the approximation of the desired RF transmit signal by the analog RF signal 301 may be achieved.

In some examples, the quantization error may represent a mean value of the quantization error 304 of the quantized length of the oscillation period and the quantization error 304 of the quantized length of an adjacent oscillation period of the digital signal. Hence, the average value for the timing error of the oscillation at the edges of the quantized oscillation period may be used for generating the second contribution 308.

Generally speaking, some examples relate to a means for generating an analog RF signal using a digital signal comprising a radius component and a second component related to an oscillation period of the digital signal. The means comprises a first means for generating a first contribution to the analog RF signal based on the radius component and a LO signal related to a quantized length of the oscillation period. The means further comprises a second means for generating a second contribution to the analog RF signal based on the LO signal and a quantization error of the quantized length of the oscillation period.

The means generating the analog RF signal may be implemented by an apparatus for generating an analog radio frequency signal using a digital signal described above or below (e.g. FIG. 3 or FIG. 4). The first means may be implemented by a first plurality of DAC cells described above or below (e.g. FIG. 3 or FIG. 4). The second means may be implemented by a second plurality of DAC cells described above or below (e.g. FIG. 3 or FIG. 4).

Figure 4:
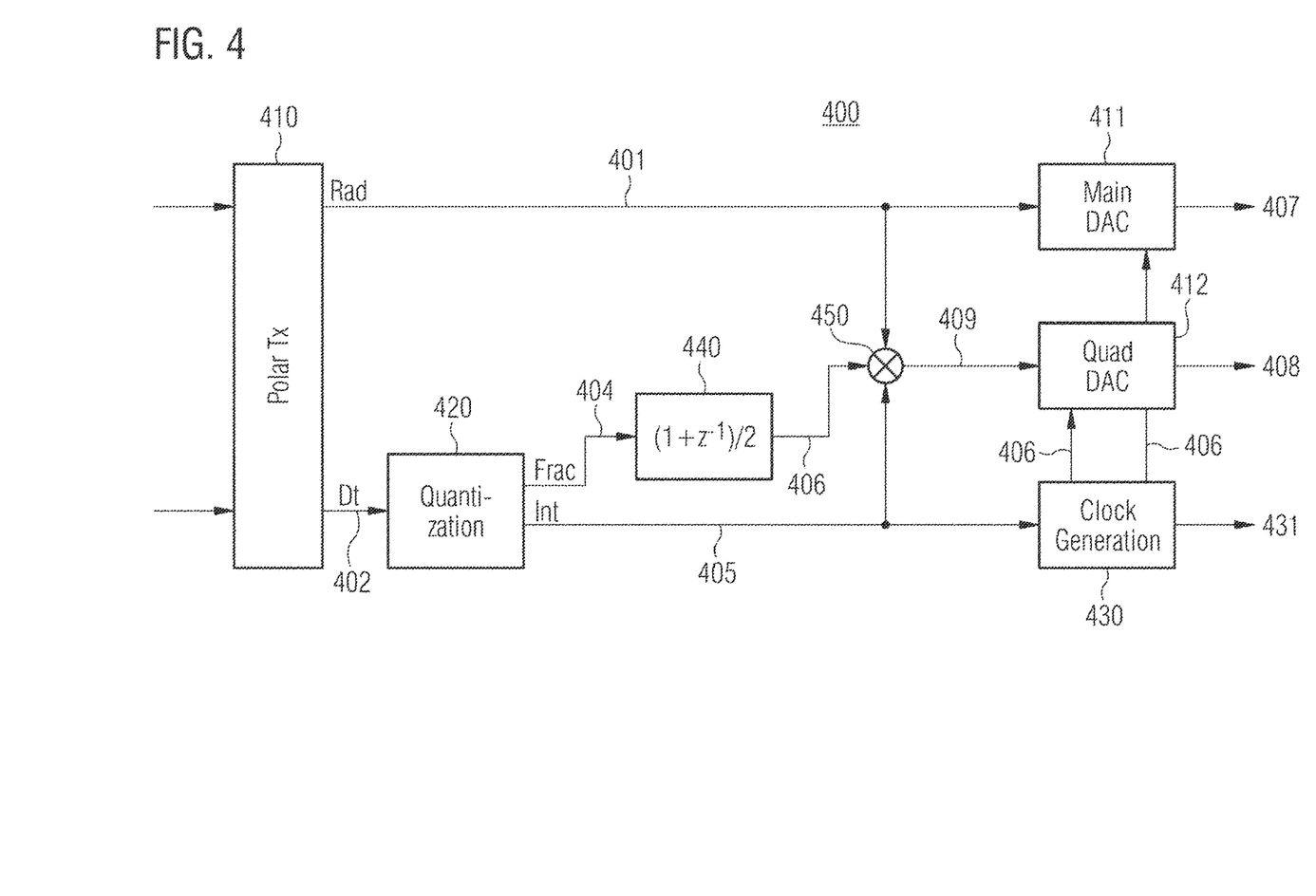
FIG. 4 illustrates an example of a polar transmitter comprising an apparatus for generating an analog RF signal using a digital signal.

FIG. 4 illustrates a polar transmitter 400 comprising an apparatus for generating an analog RF signal according to the proposed concept. The (digital) polar transmitter 400 comprises a first circuitry 410 which provides the digital signal. The digital signal has a radius component 401 and a second component 402 which comprises information on an oscillation period of the digital signal. In the situation illustrated in FIG. 4, the second component 402 comprises the information on the oscillation period in the time domain. Alternatively, the second component 402 may comprises the information on the oscillation period in the phase domain.

The second component 402 is provided to a quantization circuit 420. The quantization circuit quantizes the oscillation period of the digital signal and provides the quantized length to a LO 430 for generating a LO signal 406 (i.e. a clock signal).

A first DAC 411 (comprising a first plurality of DAC cells) receives the radius component 401 and the LO signal 406 and generates a first (analog) contribution 407 to the analog RF signal.

A quantization error 404 of the quantized length 405 of the oscillation period is provided to a processing unit 440. The processing unit 440 calculates a mean value 406 of the quantization error 404 of the quantized length of the oscillation period and the quantization error 404 of the quantized length of an adjacent oscillation period of the digital signal. In other words, the processing unit 440 calculates an average quantization error. The mean value 406 may be used due to the trigonometrical relation $$\sin(2\pi \cdot [x+d]) = \sin(2\pi \cdot x) + 2\pi \cdot d \cdot \cos(2\pi \cdot x) \qquad (1)$$

with x denoting the value of the current sample, and d denoting the quantization error (timing difference) of the current oscillation period.

The mean value 406 is provided to a weighting unit 450. The weighting unit 450 weights the mean value 406 of the quantization error with the radius component 401. In some examples, the weighting unit 450 may further weight the mean value 406 with the quantized length 405 of the oscillation period. Alternatively, the weighting unit 450 may further weight the mean value 406 with a mean value of the quantized length 405 of the oscillation period and the quantized length 405 of at least one further oscillation period of the digital signal.

The resulting weighted quantization error is provided to second DAC 412 (comprising a second plurality of DAC cells). The second DAC 412 further receives the LO signal 406 and generates the second contribution 408 to the analog RF signal.

As discussed above, combining the first contribution 407 and the second contribution 408 to the analog RF signal may allow to effectively introduce a phase offset for the oscillation within the quantized oscillation period. Accordingly, the resulting analog RF signal may be a highly accurate approximation of the desired RF transmit signal described by the digital input signal.

The second (quadrature) DAC 412 may have a (much) smaller dynamic range than first (main) DAC 411. This will become evident from the following example. Assuming a sine wave with a period length $2\pi$ and an amplitude of one, the slope of the sine wave at a zero crossing is one. Further assuming a resolution of 1 ps at a (channel) frequency of 2 GHz, the maximum relative timing error is $$\Delta t = 0.5 \cdot 2\pi \cdot \frac{1 \cdot 10^{-12}}{\frac{1}{2 \cdot 10^9}} = 0.5 \cdot 2\pi \cdot \frac{1 \cdot 10^{-12}}{500 \cdot 10^{-12}} = 0.00628, \qquad (2)$$

i.e., the maximum amplitude for the second DAC 412 is approx. 0.63% of the maximum amplitude of the first DAC 411. In some examples, the dynamic range of the second DAC 412 may be increased compared to the calculated required dynamic range in order to perform noise shaping or dithering. Accordingly, spurious signal components in the analog RF signal may be reduced.

Figure 5A:
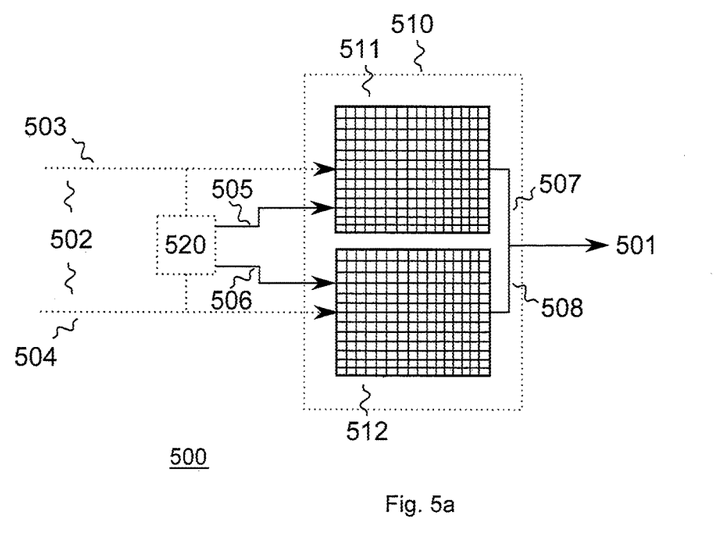
FIG. 5a illustrates an example of an apparatus for generating an analog RF signal using a sample of a digital signal.

Another example of an implementation using signal approximation according to one or more of the above aspects is illustrated in FIG. 5a. FIG. 5a illustrates an apparatus 500 for generating an analog RF signal 501 using a sample of a digital signal 502. For example, the digital signal 502 may comprise a first component and a second component. Accordingly, the sample may have a first component 503 and a second component 504.

The apparatus 500 comprises a first plurality of DAC cells 511. The first plurality of DAC cells 511 generates a first contribution 507 to the analog RF signal 501 based on a first LO signal 505. Furthermore, the apparatus 500 further comprises a second plurality of DAC cells 512. The second plurality of DAC cells 512 generates a second contribution 508 to the analog RF signal 501 based on a second LO signal 506. In some examples, the first plurality of DAC cells 511 may further use the first component 503 of the sample of the digital signal 502 for generating the first contribution 507 to the analog RF signal 501, and the second plurality of DAC cells 512 may further use the second component 504 of the sample of the digital signal 502 for generating the second contribution 508 to the analog RF signal 501.

For example, the first and the second plurality of DAC cells 511, 512 may be comprised by one DAC 510 as illustrated FIG. 5a. Accordingly, the first and the second contributions 507, 508 to the analog RF signal 501 may be combined internally in the DAC 510, so that the DAC 510 provides the analog RF signal 501.

Figure 5B:
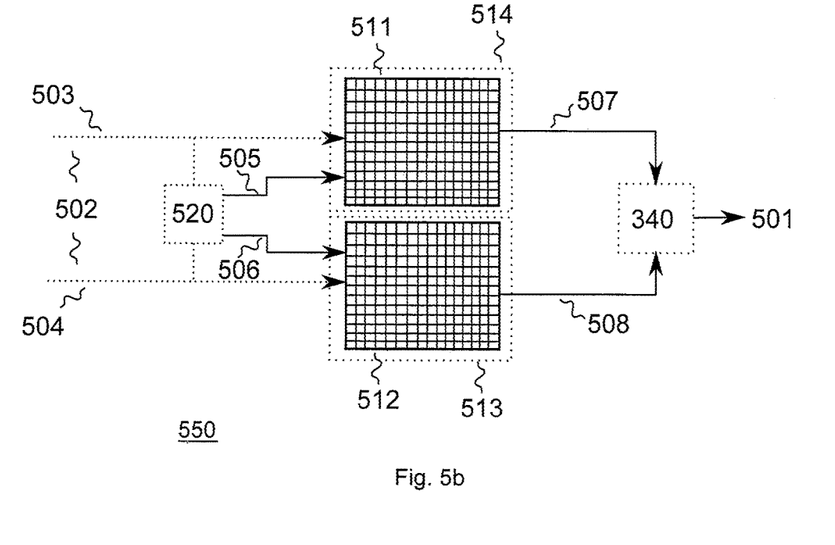
FIG. 5b illustrates another example of an apparatus for generating an analog RF signal using a sample of a digital signal.

In other examples, the first plurality of DAC cells 511 may be comprised by a first DAC 514, and the second plurality of DAC cells 512 may be comprised by a second DAC 513 as illustrated in FIG. 5b. Hence, the first contribution 507 to the analog RF signal 501 may be provided by the first DAC 514, and the second contribution 508 to the analog RF signal 501 may be provided by the second DAC 513. Accordingly, the apparatus 500 may further comprise a signal combiner 540 for combining the first contribution 507 to the analog RF signal 501 and the second contribution 508 to the analog RF signal 501.

The first and second LO signals 505, 506 may, e.g., be provided by a LO 520 based on the sample of the digital signal 502. In any case, the second LO signal 506 has a phase shift with respect to the first LO signal 505. That is, a phase of the second LO signal 506 may lead or trail a phase of the first LO signal 505. For example, the phase shift may be equal to 90°, 88°, 72°, 60°, 45°, 30°, 22.5°, etc. For the phase shift being equal to 90°, the first component 503 may, e.g., be an in-phase component, and the second component 504 may, e.g., a quadrature component.

Both, the first LO signal 505 and the second LO signal 506 are based on a calculated (i.e. expected or estimated) instantaneous frequency of the RF signal 501 for the sample of the digital signal 502. For example, a frequency of the first LO signal 505 and a frequency of the second LO signal 506 may both be based on the calculated instantaneous frequency of the RF signal 501 for the sample of the digital signal 502. In other words, the first and second LO signals 505, 506 for the first and second pluralities of DAC cells 511, 512 are both dependent on the calculated instantaneous frequency of the RF signal 501 for the sample of the digital signal 502. For example, for a first sample having a first calculated instantaneous frequency, the first LO signal 505 and the second LO signal 506 are based on the first calculated instantaneous frequency, whereas, for a second sample having a second calculated instantaneous frequency, the first LO signal 505 and the second LO signal 506 are based on the second calculated instantaneous frequency. Hence, the first and second LO signals 505, 506 for the first and second pluralities of DAC cells 511, 512 may be varied on a sample basis, i.e., sample wise. For example, the frequencies of the first and second LO signals 505, 506 may be varied for each sample. In some examples, the frequencies of the first and second LO signals 505, 506 may be equal. As indicated above, the instantaneous frequency of the RF signal for the (current) sample may be calculated by the LO 520. In other examples, the instantaneous frequency of the RF signal for the (current) sample may be calculated by another entity and be provided (supplied) to the LO 520 for generating the LO signals.

Compared to conventional transmitter architectures using two pluralities of DAC cells with two phase shifted LO signals which frequencies are equal/related to the (desired) carrier frequency of the analog RF signal, the apparatus 500 generates the analog RF signal 501 using the variable orthogonal LO signals 505, 506, which frequencies are based on the calculated instantaneous frequency of the RF signal 501 for the (current) sample of the digital signal 502. In other words, the carrier frequency of the RF signal 501 is varied sample wise. By providing the first and second LO signals 505, 506 sample wise on the basis of the calculated instantaneous frequency, effective phase offsets may be introduced so that a desired RF transmit signal (which is described by the digital signal 502) may be approximated with high accuracy by the resulting analog RF signal 501.

For example, for the phase shift being equal to 90°, the apparatus 500 generates the analog RF signal 501 not based on a pair of orthogonal LO signals which frequencies are equal/related to the (desired) carrier frequency of the analog RF signal 501, as in conventional I/Q transmitter architectures. The apparatus 500 generates the analog RF signal 501 using the variable orthogonal LO signals 505, 506 which frequencies are based on the calculated instantaneous frequency of the RF signal 501 for the (current) sample of the digital signal 502. It is known to those skilled in the art that phase jumps may occur between subsequent samples (i.e. oscillation periods) of an RF signal generated by conventional I/Q modulation. By using LO signals, which depend on the calculated instantaneous frequency of the RF signal for the (current) sample, a phase relation between subsequent samples may be adjusted. In other words, the phase jump between subsequent samples may be adjusted or at least manipulated. Accordingly, a more accurate approximation of the desired RF transmit signal by the analog RF signal 501 may be achieved compared to conventional I/Q transmitter architectures (see also FIGS. 2a to 2e highlighting this effect).

Generally speaking, some examples relate to a means for generating an analog RF signal using a sample of a digital signal. The means comprises a first means for generating a first contribution to the analog RF signal based on a first LO signal. The means further comprises a second means for generating a second contribution to the analog RF signal based on a second LO signal, wherein the second LO signal has a phase shift with respect to the first LO signal. Furthermore, the first LO signal and the second LO signal are both based on a calculated instantaneous frequency of the RF signal for the sample of the digital signal.

The means generating the analog RF signal may be implemented by an apparatus for generating an analog RF signal using a sample of a digital signal described above or below (e.g. FIG. 5). The first means may be implemented by a first plurality of DAC cells described above or below (e.g. FIG. 5). The second means may be implemented by a second plurality of DAC cells described above or below (e.g. FIG. 5).

Figure 6:
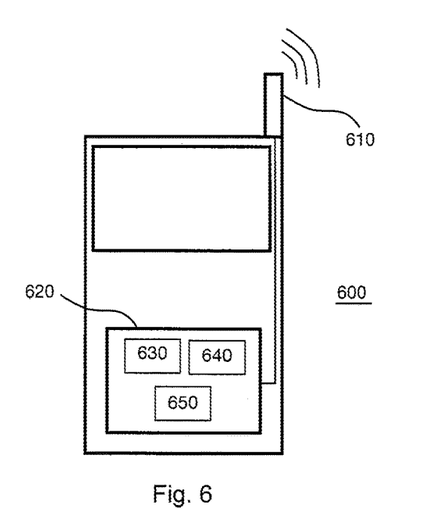
FIG. 6 illustrates an example of a mobile communications device comprising at least one of an apparatus for approximating a first signal using a second signal, and an apparatus for generating an analog RF signal using a digital signal.

An example of an implementation using RF signal generation according to one or more aspects of the proposed concept or one or more examples described above is illustrated in FIG. 6. FIG. 6 schematically illustrates an example of a mobile communications device or mobile phone or user equipment 600 comprising at least one of an apparatus 630 for approximating a first signal using a second signal according to an example described herein, an apparatus 640 for generating an analog RF signal using a digital signal according to an example described herein, or an apparatus 650 for generating an analog radio frequency signal using a sample of a digital signal according to an example described herein. The apparatus 630 and/or the apparatus 640 and/or the apparatus 650 may be comprised by a transmitter 620 (e.g. according to an example described herein). An antenna element 610 of the mobile communications device 600 may be coupled to the transmitter 620. To this end, mobile communications devices may be provided with reduced power consumption compared to conventional mobile communications devices using polar transmitters with DTCs. Hence, a user experience may be improved.

Figure 7:
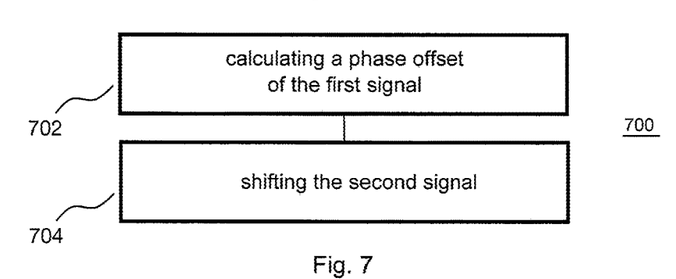
FIG. 7 illustrates a flowchart of an example of a method for approximating a first signal using a second signal.

An example of a method 700 for approximating a first signal within a quantized time interval using a second signal is illustrated by means of a flowchart in FIG. 7. The first signal comprises a first oscillation period and the second signal comprises a different second oscillation period. The method comprises calculating 702 a phase offset of the first signal at at least one position within the quantized time interval. Further, the method comprises shifting 704 the second signal within the quantized time interval until a phase offset of the second signal at the one position satisfies a quality criterion related to the phase offset of the first signal.

More details and aspects of the method are mentioned in connection with the proposed concept or one or more examples described above (e.g. FIGS. 1-5). The method may comprise one or more additional optional features corresponding to one or more aspects of the proposed concept or one or more examples described above.

Figure 8:
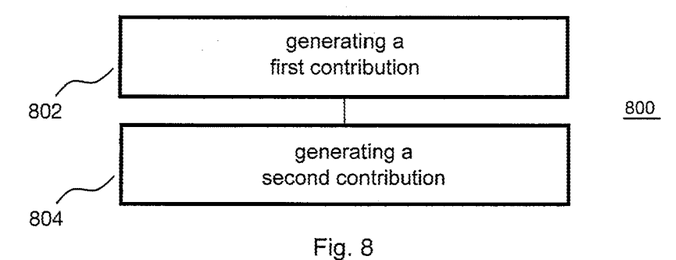
FIG. 8 illustrates a flowchart of an example of a method for generating an analog RF signal using a digital signal.

An example of a method 800 for generating an analog radio frequency signal using a digital signal is illustrated by means of a flowchart in FIG. 8. The digital signal comprises a radius component and a second component related to an oscillation period of the digital signal. The method comprises generating 802 a first contribution to the analog radio frequency signal based on the radius component and a local oscillator signal related to a quantized length of the oscillation period. Further, the method comprises generating 804 a second contribution to the analog radio frequency signal based on a quantization error of the quantized length of the oscillation period and the local oscillator signal.

More details and aspects of the method are mentioned in connection with the proposed concept or one or more examples described above (e.g. FIGS. 1-5). The method may comprise one or more additional optional features corresponding to one or more aspects of the proposed concept or one or more examples described above.

Figure 9:
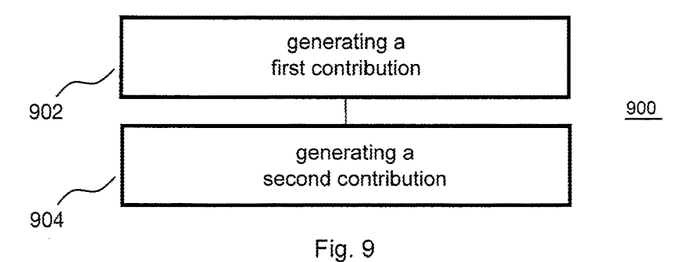
FIG. 9 illustrates a flowchart of an example of a method for generating an analog RF signal using a sample of a digital signal.

An example of a method 900 for generating an analog radio frequency signal using a sample of a digital signal is illustrated by means of a flowchart in FIG. 9. The method comprises generating 902 a first contribution to the analog radio frequency signal based on a first local oscillator signal. Further, the method comprises generating 904 a second contribution to the analog radio frequency signal based on a second local oscillator signal, wherein the second local oscillator signal has a phase shift with respect to the first local oscillator signal. Furthermore, the first local oscillator signal and the second local oscillator signal are both based on a calculated instantaneous frequency of the radio frequency signal for the sample of the digital signal.

More details and aspects of the method are mentioned in connection with the proposed concept or one or more examples described above (e.g. FIGS. 1-5). The method may comprise one or more additional optional features corresponding to one or more aspects of the proposed concept or one or more examples described above.

The examples as described herein may be summarized as follows:

Example 1 is an apparatus for approximating a first signal within a quantized time interval using a second signal, wherein the first signal comprises a first oscillation period and the second signal comprises a second oscillation period, the apparatus comprising: a processing module configured to calculate a phase offset of the first signal at at least one position within the quantized time interval; and a shifting module configured to shift the second signal within the quantized time interval until a phase offset of the second signal at the at least one position satisfies a quality criterion related to the phase offset of the first signal.

In example 2, the at least one position is the center of the quantized time interval in the apparatus of example 1, wherein the phase offset of the second signal is equal to the phase offset of the first signal at the center of the quantized time interval.

In example 3, the at least one position is a first edge of the quantized time interval and a second position is a second edge of the quantized time interval in the apparatus of example 1, wherein the phase offset of the second signal at the first edge and the second edge is equal to a mean value of the phase offsets of the first signal at the first edge and the second edge of the quantized time interval.

Example 4 is an apparatus for generating an analog radio frequency signal using a digital signal comprising a radius component and a second component related to an oscillation period of the digital signal, comprising: a first plurality of digital-to-analog converter cells configured to generate a first contribution to the analog radio frequency signal based on the radius component and a local oscillator signal related to a quantized length of the oscillation period; and a second plurality of digital-to-analog converter cells configured to generate a second contribution to the analog radio frequency signal based on the local oscillator signal and a quantization error of the quantized length of the oscillation period.

In example 5, the first plurality of digital-to-analog converter cells and the second plurality of digital-to-analog converter cells of the apparatus of example 4 are comprised by one digital-to-analog converter.

In example 6, the first plurality of digital-to-analog converter cells of the apparatus of example 4 is comprised by a first digital-to-analog converter, the second plurality of digital-to-analog converter cells is comprised by a second digital-to-analog converter, and the apparatus further comprises a signal combiner configured to combine the first contribution to the analog radio frequency signal and the second contribution to the analog radio frequency signal.

In example 7, the second plurality of digital-to-analog converter cells of the apparatus of any of examples 4 to 6 is further configured to generate the second contribution to the analog radio frequency signal based on the radius component.

In example 8, the apparatus of example 7 further comprises a weighting unit configured to weight the quantization error with the radius component.

In example 9, the weighting unit of the apparatus of example 8 is further configured to weight the quantization error with the quantized length of the oscillation period.

In example 10, the weighting unit of the apparatus of example 8 is further configured to weight the quantization error with a mean value of the quantized length of the oscillation period and the quantized length of at least one further oscillation period of the digital signal.

In example 11, the quantization error in the apparatus of any of examples 4 to 10 represents a mean value of the quantization error of the quantized length of the oscillation period and the quantization error of the quantized length of an adjacent oscillation period of the digital signal.

Example 12 is an apparatus for generating an analog radio frequency signal using a sample of a digital signal, comprising: a first plurality of digital-to-analog converter cells configured to generate a first contribution to the analog radio frequency signal based on a first local oscillator signal; and a second plurality of digital-to-analog converter cells configured to generate a second contribution to the analog radio frequency signal based on a second local oscillator signal, the second local oscillator signal having a phase shift with respect to the first local oscillator signal, wherein the first local oscillator signal and the second local oscillator signal are both based on a calculated instantaneous frequency of the radio frequency signal for the sample of the digital signal.

In example 13, a frequency of the first local oscillator signal and a frequency of the second local oscillator signal in the apparatus of example 12 are both based on the calculated instantaneous frequency of the radio frequency signal for the sample of the digital signal.

In example 14, the first plurality of digital-to-analog converter cells of the apparatus of example 12 or example 13 is further configured to generate the first contribution to the analog radio frequency signal based on an first component of the sample, wherein the second plurality of digital-to-analog converter cells is further configured to generate the second contribution to the analog radio frequency signal based on a second component of the sample.

In example 15, the first plurality of digital-to-analog converter cells of the apparatus of any of example 12 to 14 and the second plurality of digital-to-analog converter cells are comprised by one digital-to-analog converter.

In example 16, the first plurality of digital-to-analog converter cells of the apparatus of any of example 12 to 14 is comprised by a first digital-to-analog converter, the second plurality of digital-to-analog converter cells is comprised by a second digital-to-analog converter, and the apparatus further comprises a signal combiner configured to combine the first contribution to the analog radio frequency signal and the second contribution to the analog radio frequency signal.

Example 17 is a transmitter comprising at least one of an apparatus for approximating an oscillation period of a first signal according to any of examples 1 to 3, an apparatus for generating an analog radio frequency signal according to any of examples 4 to 11, and an apparatus for generating an analog radio frequency signal according to any of examples 12 to 16.

Example 18 is a mobile communications device comprising a transmitter according to example 17.

In example 19, the mobile communications device of example 18 further comprises at least one antenna coupled to the transmitter.

Example 20 is a means for approximating a first signal within a quantized time interval using a second signal, wherein the first signal comprises a first oscillation period and the second signal comprises a second oscillation period, the apparatus comprising: a means for calculating a phase offset of the first signal at at least one position within the quantized time interval; and a means for shifting the second signal within the quantized time interval until a phase offset of the second signal at the at least one position satisfies a quality criterion related to the phase offset of the first signal.

In example 21, the at least one position is the center of the quantized time interval in the means of example 20, and the phase offset of the second signal is equal to the phase offset of the first signal at the center of the quantized time interval.

Example 22 is a means for generating an analog radio frequency signal using a digital signal comprising a radius component and a second component related to an oscillation period of the digital signal, comprising: a first means for generating a first contribution to the analog radio frequency signal based on the radius component and a local oscillator signal related to a quantized length of the oscillation period; and a second means for generating a second contribution to the analog radio frequency signal based on the local oscillator signal and a quantization error of the quantized length of the oscillation period.

In example 23, the second means in the means of example 22 is further configured to generate the second contribution to the analog radio frequency signal based on the radius component.

Example 24 is a means for generating an analog radio frequency signal using a sample of a digital signal, comprising: a first means for generating a first contribution to the analog radio frequency signal based on a first local oscillator signal; and a second means for generating a second contribution to the analog radio frequency signal based on a second local oscillator signal, the second local oscillator signal having a phase shift with respect to the first local oscillator signal, wherein the first local oscillator signal and the second local oscillator signal are both based on a calculated instantaneous frequency of the radio frequency signal for the sample of the digital signal.

In example 25, a frequency of the first local oscillator signal and a frequency of the second local oscillator signal in the means of example 24 are both based on the calculated instantaneous frequency of the radio frequency signal for the sample of the digital signal.

Examples 26 is a method for approximating a first signal within a quantized time interval using a second signal, wherein the first signal comprises a first oscillation period and the second signal comprises a second oscillation period, the method comprising: calculating a phase offset of the first signal at at least one position within the quantized time interval; and shifting the second signal within the quantized time interval until a phase offset of the second signal at the at least one position satisfies a quality criterion related to the phase offset of the first signal.

In example 27, the at least one position is the center of the quantized time interval in the method of example 26, wherein the phase offset of the second signal is equal to the phase offset of the first signal at the center of the quantized time interval.

In example 28, the at least one position is a first edge of the quantized time interval and a second position is a second edge of the quantized time interval in the method of example 26, wherein the phase offset of the second signal at the first edge and the second edge is equal to a mean value of the phase offset of the first signal at the first edge and the second edge of the quantized time interval.

Example 29 is a method for generating an analog radio frequency signal using a digital signal comprising a radius component and a second component related to an oscillation period of the digital signal, comprising: generating a first contribution to the analog radio frequency signal based on the radius component and a local oscillator signal related to a quantized length of the oscillation period; and generating a second contribution to the analog radio frequency signal based on the local oscillator signal and a quantization error of the quantized length of the oscillation period.

In example 30, the first contribution to the analog radio frequency signal in the method of example 29 is generated by a first plurality of digital-to-analog converter cells of a digital-to-analog converter, wherein the second contribution to the analog radio frequency signal is generated by a second plurality of digital-to-analog converter cells of the digital-to-analog converter.

In example 31, wherein the first contribution to the analog radio frequency signal in the method of example 29 is generated by a first digital-to-analog converter, wherein the second contribution to the analog radio frequency signal is generated by a second digital-to-analog converter, and wherein the method further comprises combining the first contribution to the analog radio frequency signal and the second contribution to the analog radio frequency signal.

In example 32, wherein generating the second contribution to the analog radio frequency signal in the method of any of examples 29 to 31 is further based on the radius component.

In example 33, the method of example 32 further comprises weighting the quantization error with the radius component.

In example 34, the method of any of examples 29 to 33 further comprises weighting the quantization error with the quantized length of the oscillation period.

In example 35, the method of any of examples 29 to 33 further comprises weighting the quantization error with a mean value of the quantized length of the oscillation period and the quantized length of at least one further oscillation period of the digital signal.

In example 36, the quantization error in the method of any of examples 29 to 35 represents a mean value of the quantization error of the quantized length of the oscillation period and the quantization error of the quantized length of an adjacent oscillation period of the digital signal.

Example 37 is a method for generating an analog radio frequency signal using a sample of a digital signal, comprising: generating a first contribution to the analog radio frequency signal based on a first local oscillator signal; and generating a second contribution to the analog radio frequency signal based on a second local oscillator signal, the second local oscillator signal having a phase shift with respect to the first local oscillator signal, wherein the first local oscillator signal and the second local oscillator signal are both based on a calculated instantaneous frequency of the radio frequency signal for the sample of the digital signal.

In example 38, a frequency of the first local oscillator signal and a frequency of the second local oscillator signal in the method of example 37 are both based on the calculated instantaneous frequency of the radio frequency signal for the sample of the digital signal.

In example 39, generating the first contribution to the analog radio frequency signal in the method of example 37 or example 38 is further based on a first component of the sample, wherein generating the second contribution to the analog radio frequency signal is further based on a second component of the sample.

In example 40, the first contribution to the analog radio frequency signal in the method of any of examples 37 to 39 is generated by a first plurality of digital-to-analog converter cells of a digital-to-analog converter, wherein the second contribution to the analog radio frequency signal is generated by a second plurality of digital-to-analog converter cells of the digital-to-analog converter.

In example 41, the first contribution to the analog radio frequency signal in the method of any of examples 37 to 39 is generated by a first digital-to-analog converter, wherein the second contribution to the analog radio frequency signal is generated by a second digital-to-analog converter, and wherein the method further comprises combining the first contribution to the analog radio frequency signal and the second contribution to the analog radio frequency signal.

Example 42 is a computer readable storage medium having stored thereon a program having a program code for performing the method of any of examples 26 to 41, when the program is executed on a computer or processor.

Example 43 is a computer program having a program code configured to perform the method of any of examples 26 to 41, when the computer program is executed on a computer or processor.

Further RF signal generation related aspects that may be applied to examples herein are described in co-pending International Patent Application No. PCT/IB2015/57375, filed under the Patent Cooperation Treaty (PCT) on Sep. 25, 2015, entitled "AN APPARATUS AND A METHOD FOR GENERATING A RADIO FREQUENCY SIGNAL"; co-pending International Patent Application No. PCT/IB2015/57377, filed under the PCT on Sep. 25, 2015, entitled "AN APPARATUS AND A METHOD FOR GENERATING A RADIO FREQUENCY SIGNAL"; and co-pending International Patent Application No. PCT/IB2015/57376, filed under the PCT on Sep. 25, 2015, entitled "APPARATUSES AND METHODS FOR GENERATING A RADIO FREQUENCY SIGNAL, A MODULATOR, A CONTROLLER FOR A MODULATOR, AND A METHOD FOR CONTROLLING A MODULATOR".

Examples may further be a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other example examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. An apparatus for generating an analog radio frequency signal using a digital signal comprising a radius component and a second component related to an oscillation period of the digital signal, comprising:
    a first plurality of digital-to-analog converter cells configured to generate a first contribution to the analog radio frequency signal based on the radius component and a local oscillator signal related to a quantized length of the oscillation period; and
    a second plurality of digital-to-analog converter cells configured to generate a second contribution to the analog radio frequency signal based on the local oscillator signal and a quantization error of the quantized length of the oscillation period.

2. The apparatus of claim 1, wherein the first plurality of digital-to-analog converter cells and the second plurality of digital-to-analog converter cells are comprised by one digital-to-analog converter.

3. The apparatus of claim 1, wherein the first plurality of digital-to-analog converter cells is comprised by a first digital-to-analog converter, wherein the second plurality of digital-to-analog converter cells is comprised by a second digital-to-analog converter, and wherein the apparatus further comprises a signal combiner configured to combine the first contribution to the analog radio frequency signal and the second contribution to the analog radio frequency signal.

4. The apparatus of claim 1, wherein the second plurality of digital-to-analog converter cells is further configured to generate the second contribution to the analog radio frequency signal based on the radius component.

5. The apparatus of claim 4, wherein the apparatus further comprises a weighting unit configured to weight the quantization error with the radius component.

6. The apparatus of claim 5, wherein the weighting unit is further configured to weight the quantization error with the quantized length of the oscillation period.

7. The apparatus of claim 5, wherein the weighting unit is further configured to weight the quantization error with a mean value of the quantized length of the oscillation period and the quantized length of at least one further oscillation period of the digital signal.

8. The apparatus of claim 1, wherein the quantization error represents a mean value of the quantization error of the quantized length of the oscillation period and the quantization error of the quantized length of an adjacent oscillation period of the digital signal.

9. An apparatus for generating an analog radio frequency signal using a sample of a digital signal, comprising:
    a first plurality of digital-to-analog converter cells configured to generate a first contribution to the analog radio frequency signal based on a first local oscillator signal; and
    a second plurality of digital-to-analog converter cells configured to generate a second contribution to the analog radio frequency signal based on a second local oscillator signal, the second local oscillator signal having a phase shift with respect to the first local oscillator signal,
    wherein the first local oscillator signal and the second local oscillator signal are both based on a calculated instantaneous frequency of the radio frequency signal for the sample of the digital signal.

10. The apparatus of claim 9, wherein a frequency of the first local oscillator signal and a frequency of the second local oscillator signal are both based on the calculated instantaneous frequency of the radio frequency signal for the sample of the digital signal.

11. The apparatus of claim 9, wherein the first plurality of digital-to-analog converter cells is further configured to generate the first contribution to the analog radio frequency signal based on an first component of the sample, and wherein the second plurality of digital-to-analog converter cells is further configured to generate the second contribution to the analog radio frequency signal based on a second component of the sample.

12. The apparatus of claim 9, wherein the first plurality of digital-to-analog converter cells and the second plurality of digital-to-analog converter cells are comprised by one digital-to-analog converter.

13. The apparatus of claim 9, wherein the first plurality of digital-to-analog converter cells is comprised by a first digital-to-analog converter, wherein the second plurality of digital-to-analog converter cells is comprised by a second digital-to-analog converter, and wherein the apparatus further comprises a signal combiner configured to combine the first contribution to the analog radio frequency signal and the second contribution to the analog radio frequency signal.

14. A method for generating an analog radio frequency signal using a digital signal comprising a radius component and a second component related to an oscillation period of the digital signal, comprising:
    generating a first contribution to the analog radio frequency signal based on the radius component and a local oscillator signal related to a quantized length of the oscillation period; and
    generating a second contribution to the analog radio frequency signal based on the local oscillator signal and a quantization error of the quantized length of the oscillation period.

15. The method of claim 14, wherein the first contribution to the analog radio frequency signal is generated by a first plurality of digital-to-analog converter cells of a digital-to-analog converter, and wherein the second contribution to the analog radio frequency signal is generated by a second plurality of digital-to-analog converter cells of the digital-to-analog converter.

16. The method of claim 14, wherein the first contribution to the analog radio frequency signal is generated by a first digital-to-analog converter, wherein the second contribution to the analog radio frequency signal is generated by a second digital-to-analog converter, and wherein the method further comprises combining the first contribution to the analog radio frequency signal and the second contribution to the analog radio frequency signal.

17. The method of claim 14, wherein generating the second contribution to the analog radio frequency signal is further based on the radius component.

18. The method of claim 17, wherein the method further comprises weighting the quantization error with the radius component.

19. The method of claim 14, wherein the method further comprises weighting the quantization error with the quantized length of the oscillation period.

20. The method of claim 14, wherein the method further comprises weighting the quantization error with a mean value of the quantized length of the oscillation period and the quantized length of at least one further oscillation period of the digital signal.

21. The method of claim 14, wherein the quantization error represents a mean value of the quantization error of the quantized length of the oscillation period and the quantization error of the quantized length of an adjacent oscillation period of the digital signal.

22. A method for generating an analog radio frequency signal using a sample of a digital signal, comprising:
  generating a first contribution to the analog radio frequency signal based on a first local oscillator signal; and
  generating a second contribution to the analog radio frequency signal based on a second local oscillator signal, the second local oscillator signal having a phase shift with respect to the first local oscillator signal,
  wherein the first local oscillator signal and the second local oscillator signal are both based on a calculated instantaneous frequency of the radio frequency signal for the sample of the digital signal.

23. The method of claim 22, wherein a frequency of the first local oscillator signal and a frequency of the second local oscillator signal are both based on the calculated instantaneous frequency of the radio frequency signal for the sample of the digital signal.

24. The method of claim 22, wherein generating the first contribution to the analog radio frequency signal is further based on a first component of the sample, and wherein generating the second contribution to the analog radio frequency signal is further based on a second component of the sample.

25. The method of claim 22, wherein the first contribution to the analog radio frequency signal is generated by a first plurality of digital-to-analog converter cells of a digital-to-analog converter, and wherein the second contribution to the analog radio frequency signal is generated by a second plurality of digital-to-analog converter cells of the digital-to-analog converter.

* * * * *